(12) United States Patent
Gambino et al.

(10) Patent No.: US 8,394,718 B1
(45) Date of Patent: Mar. 12, 2013

(54) METHODS OF FORMING SELF-ALIGNED THROUGH SILICON VIA

(75) Inventors: Jeffrey P. Gambino, Westford, VT (US);
Robert K. Leidy, Burlington, VT (US);
Anthony K. Stamper, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/229,912

(22) Filed: Sep. 12, 2011

(51) Int. Cl.
*H01L 21/44* (2006.01)
*H01L 21/311* (2006.01)
*H01L 21/4763* (2006.01)

(52) U.S. Cl. ........ 438/673; 438/694; 438/640; 438/701; 257/E21.578

(58) Field of Classification Search ........................ None
See application file for complete search history.

(56) References Cited

U.S. PATENT DOCUMENTS

| | | | |
|---|---|---|---|
| 4,372,033 A * | 2/1983 | Chiao | 438/447 |
| 5,183,795 A * | 2/1993 | Ting et al. | 438/618 |
| 6,187,685 B1 * | 2/2001 | Hopkins et al. | 438/710 |
| 6,867,073 B1 | 3/2005 | Enquist | |
| 6,887,785 B1 | 5/2005 | Dobuzinsky et al. | |
| 7,799,678 B2 | 9/2010 | Kropewnicki et al. | |
| 7,973,413 B2 * | 7/2011 | Kuo et al. | 257/774 |
| 8,043,973 B2 * | 10/2011 | Goodlin et al. | 438/739 |
| 2009/0051039 A1 | 2/2009 | Kuo et al. | |
| 2009/0269897 A1 * | 10/2009 | Anderson et al. | 438/275 |
| 2009/0294983 A1 | 12/2009 | Cobbley et al. | |
| 2010/0013060 A1 | 1/2010 | Lamy et al. | |
| 2010/0032764 A1 | 2/2010 | Andry et al. | |
| 2010/0244247 A1 | 9/2010 | Chang et al. | |
| 2012/0077349 A1 * | 3/2012 | Li et al. | 438/762 |

* cited by examiner

*Primary Examiner* — Seahvosh Nikmanesh
*Assistant Examiner* — Evren Seven
(74) *Attorney, Agent, or Firm* — Richard M. Kotulak; Hoffman Warnick LLC

(57) ABSTRACT

A method for forming a through silicon via (TSV) in a substrate may include forming a dielectric layer on the substrate; forming an opening through the dielectric layer and into the substrate using a single mask over the dielectric layer; expanding the opening in the dielectric layer, undercutting the single mask, to form an expanded upper portion; removing the single mask; and filling the opening, including the expanded upper portion, with a conductor. A resulting structure may include a substrate; a dielectric layer over the substrate; and a self-aligned through silicon via (TSV) extending through the dielectric layer and the substrate.

16 Claims, 4 Drawing Sheets

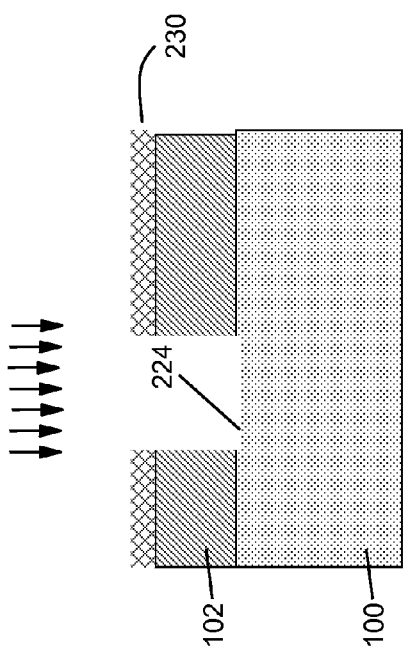
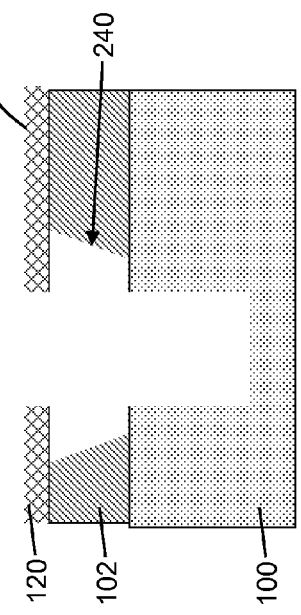
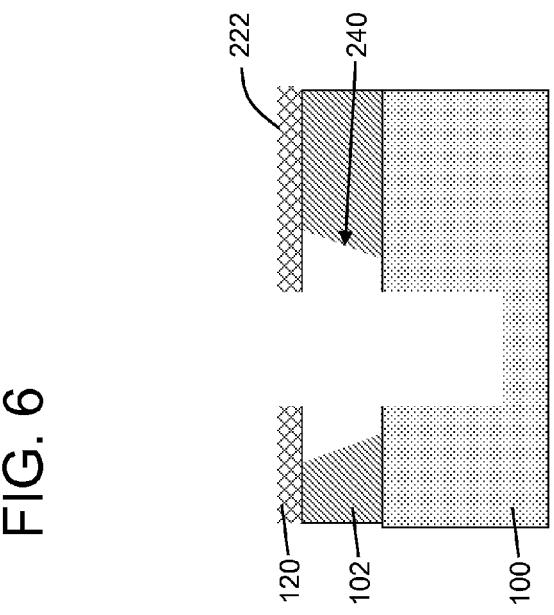
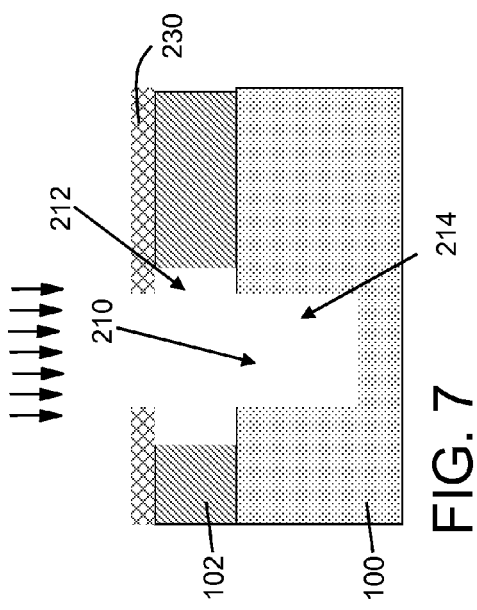
FIG. 5
FIG. 6
FIG. 7
FIG. 8

METHODS OF FORMING SELF-ALIGNED THROUGH SILICON VIA

BACKGROUND OF THE INVENTION

1. Technical Field

The present invention relates generally to semiconductor fabrication, and more particularly, to processes related to forming through silicon vias (TSVs).

2. Related Art

Through silicon vias (TSVs) are vias etched through a substrate, e.g., a silicon (Si) wafer. TSVs may be used, for example, to allow wafer-to-wafer interconnect schemes such as those compatible with three dimensional wafer-level packaging. Openings for TSVs typically include an enlarged portion near an upper surface so that the opening can be more readily filled with a conductor. Current processes use at least two masks to form the TSV opening: a first mask used to open any layer over the substrate and open an upper portion of the substrate (e.g., silicon), and a second mask to open a lower portion of the substrate. In some cases, a third mask is used to create pre-metallization openings to ensure metallization level conductor alignment with the TSV.

SUMMARY OF THE INVENTION

A first aspect of the invention is directed to a method for forming a through silicon via (TSV) in a substrate, the method comprising: forming a dielectric layer on the substrate; forming an opening through the dielectric layer and into the substrate using a single mask over the dielectric layer; expanding the opening in the dielectric layer, undercutting the single mask, to form an expanded upper portion; removing the single mask; and filling the opening, including the expanded upper portion, with a conductor.

A second aspect of the invention includes a method for forming a through silicon via (TSV) in a substrate, the method comprising: forming a dielectric layer on the substrate; forming an opening through the dielectric layer and into the substrate using a single mask over the dielectric layer, the opening forming including performing a first reactive ion etch to a surface of the substrate, and performing a second reactive ion etch into the substrate; expanding the opening in the dielectric layer, undercutting the single mask by performing a wet etch through the opening to form an expanded upper portion in the opening; removing the single mask; rounding corners of an upper part of the opening in the substrate; and filling the opening, including the expanded upper portion, with a conductor.

A third aspect of the invention related to a method forming a through silicon via (TSV) in a substrate, the method comprising: forming a dielectric layer on the substrate; forming an opening through the dielectric layer and into the substrate using a single mask over the dielectric layer; expanding the opening in the dielectric layer, undercutting the single mask, to form an expanded upper portion; removing the single mask; performing a pulsed etching to round corners of the substrate at an upper part of the opening in the substrate; and filling the opening, including the expanded upper portion, with a conductor.

The foregoing and other features of the invention will be apparent from the following more particular description of embodiments of the invention.

BRIEF DESCRIPTION OF THE DRAWINGS

The embodiments of this invention will be described in detail, with reference to the following figures, wherein like designations denote like elements, and wherein:

FIGS. 5-7 show another embodiment of a method of forming an opening for a TSV according to embodiments of the invention.

FIG. 8 shows an optional step of the process of forming an opening for a TSV according to embodiments of the invention.

DETAILED DESCRIPTION

Figure 1:
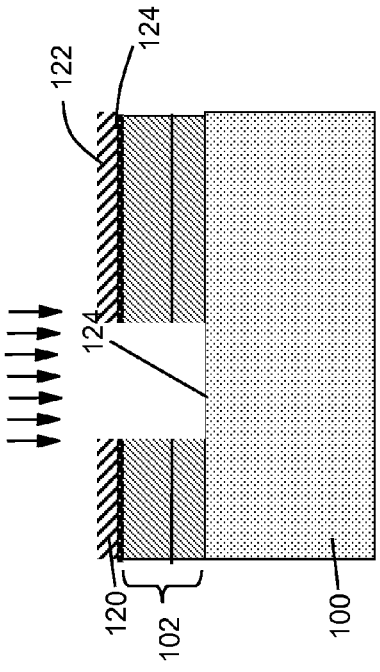
FIGS. 1-4 show one embodiment of a method of forming an opening for a TSV according to embodiments of the invention.

Turning to the drawings, embodiments of a method for forming a through silicon via (TSV) in a substrate are illustrated. FIG. 1 shows an initial structure including a substrate 100. Substrate 100 may include silicon (Si). However, substrate 100 may included but is not limited to silica glass (amorphous silicon dioxide), alumina, sapphire, silicon, germanium, silicon germanium, silicon carbide, and those materials consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Furthermore, a portion or entire semiconductor substrate may be strained.

FIG. 1 also shows forming a dielectric layer 102 on substrate 100. In one embodiment, dielectric layer 102 may include a silica glass layer 104 and a silicon nitride layer ($Si_3N_4$) 106 (separate layers labeled only in FIG. 1). In one embodiment, silica glass layer 104 may include phosphor-silica glass (PSG) or boro-phospho-silica glass (BPSG) having a graded phosphorous content for reasons to be described herein. However, dielectric layer 102 may include other now known or later developed interlayer dielectric(s) such as but not limited to: silicon nitride ($Si_3N_4$), silicon oxide ($SiO_2$), fluorinated $SiO_2$ (FSG), hydrogenated silicon oxycarbide (Si-COH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, SiLK (a polyarylene ether available from Dow Chemical Corporation), a spin-on silicon-carbon containing polymer material available from JSR Corporation, other low dielectric constant (<3.9) material, or layers thereof. In one embodiment, the silicon nitride has a thickness of, for example, about 50 nanometers, and the silica glass has a thickness of about 1 micrometer (μm). Other thicknesses may also be possible. Substrate 100 and dielectric layer 102 may be formed using any now known or later developed techniques.

Figure 2:
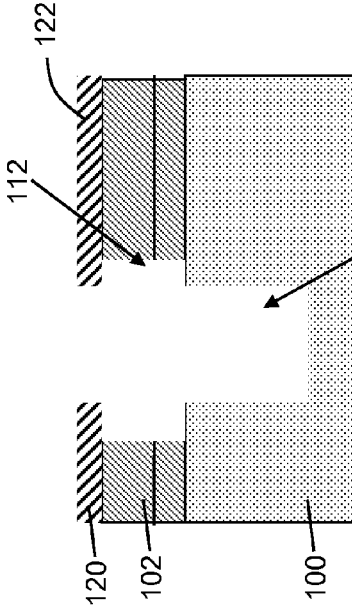
Figure 3:
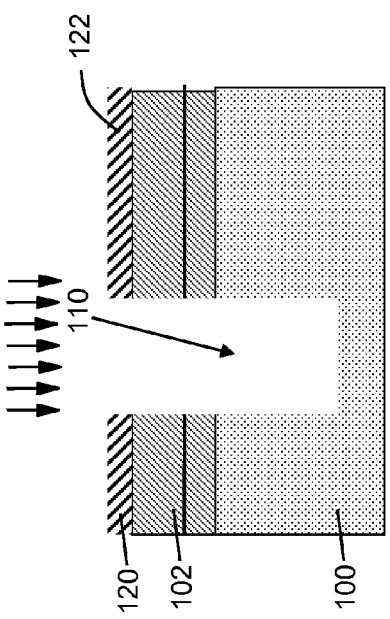
Figure 4:
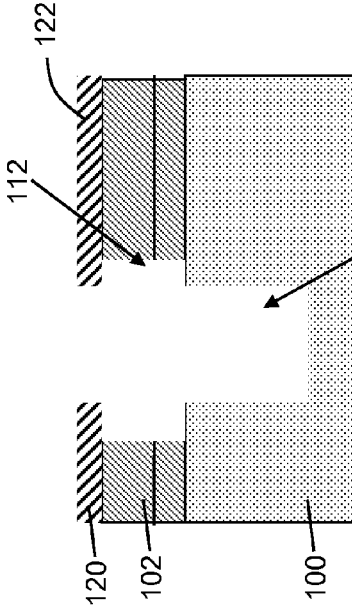

FIGS. 2-4 show one embodiment of forming an opening 110 (FIG. 3) through dielectric layer 102 and into substrate 100 using a single mask 120 over dielectric layer 102. In FIGS. 2-4, single mask 120 includes a photoresist layer 122, or a photoresist layer 122 and an anti-reflective coating (ARC) 124 (FIG. 2 only). Any now known or later developed photoresist or ARC material may be employed. As illustrated in FIGS. 2-3, in one embodiment, photoresist layer 120 is patterned and a first reactive ion etch (RIE) is performed to a surface 124 of substrate 100 (i.e., through dielectric layer 102), and then a second reactive ion etch (RIE) is performed into substrate 100, to complete the forming of opening 110. Other processes may also be possible. For example purposes only, opening 110 may be about 3 μm wide, and may be elongated rather than circular in cross-section.

Referring to FIG. 4, opening 110 (FIG. 3) is expanded, resulting in a larger lower portion 114 being etched into substrate 100 (compared to FIG. 3), and opening 110 being expanded in dielectric layer 102, undercutting single mask 120, to form an expanded upper portion 112. This process may include performing a wet etch through opening 110 to form expanded upper portion 112. The wet etch may include, but is not limited to, use of a buffered hydrofluoric (BHF) acid etch. Other wet or dry chemical etches to undercut into dielectric layer 102 may also be employed. In this fashion, an enlarged upper portion 112 (compared to opening 110 in FIG. 3) and smaller lower portion 114 (compared to expanded upper portion 112) may be generated for a TSV using a single mask, rather than the conventional 2-3 masks.

Referring to FIGS. 5-7, an alternative embodiment of forming an opening 210 (FIG. 7) through dielectric layer 102 and into substrate 100 using a single mask in the form of an inorganic composite hard mask layer 220. Inorganic composite hard mask layer 220 may include a patterned photoresist layer 232 over a hard mask layer 230. In embodiments, hard mask layer 230 includes one or more layers of inorganic dielectric or metal. Hard mask layer 230 may include, for example, at least one of: alumina, titanium nitride, silicon dioxide, and silicon nitride. Other composite hard mask layers and masking layer 230 materials may also be employed. In one embodiment, as illustrated in FIGS. 6-7, photoresist layer 232 is patterned and developed, a first reactive ion etch (RIE) is performed to a surface 224 of substrate 100, removing hard mask layer 230, then a second reactive ion etch (RIE) is performed into substrate 100, to complete forming opening 210, and complete photoresist layer 232 removal. Alternatively, photoresist layer 232 could be removed before etching layers 102 or 100. Other processes may also be possible. One purpose of hard mask layer 230 is to eliminate the need to put wafers with photoresist on them into the subsequent BHF or other wet or dry chemical etch to undercut into dielectric layer 102.

Referring to FIG. 7, opening 110 is expanded, resulting in a larger lower portion 214 (compared to expanded upper portion 212) being etched into substrate 100, and opening 210 being expanded in dielectric layer 102, undercutting single mask 220 (i.e., remaining layer 230), to form expanded upper portion 212. This process may include performing a wet etch through opening 210 to form expanded upper portion 212. The wet etch may include, but is not limited to use of a buffered hydrofluoric (BHF) acid etch, or other wet or dry chemical etch(es) to undercut into dielectric layer 102. In this fashion, an expanded upper portion 212 and smaller lower portion 214 (compared to expanded upper portion 212) may be generated for a TSV using a single mask, rather than the conventional 2-3 masks.

FIG. 8 shows an alternative embodiment in which dielectric layer 102 includes a silica glass having graded stoichiometry such that an upper layer etches faster than a lower layer thereof. For example, dielectric layer 102 could include a PSG with greater phosphorus content in the upper portion; or BPSG with lower boron content in the upper portion of the layer. In this case, the opening forming creates a tapered opening 240 due to the increased BHF etch rate at the top of dielectric layer 102 from an upper part of dielectric layer 102 to a lower part of the dielectric layer. This process may be employed, for example, where a larger upper surface area for a TSV dielectric opening may be desired.

Figure 10:
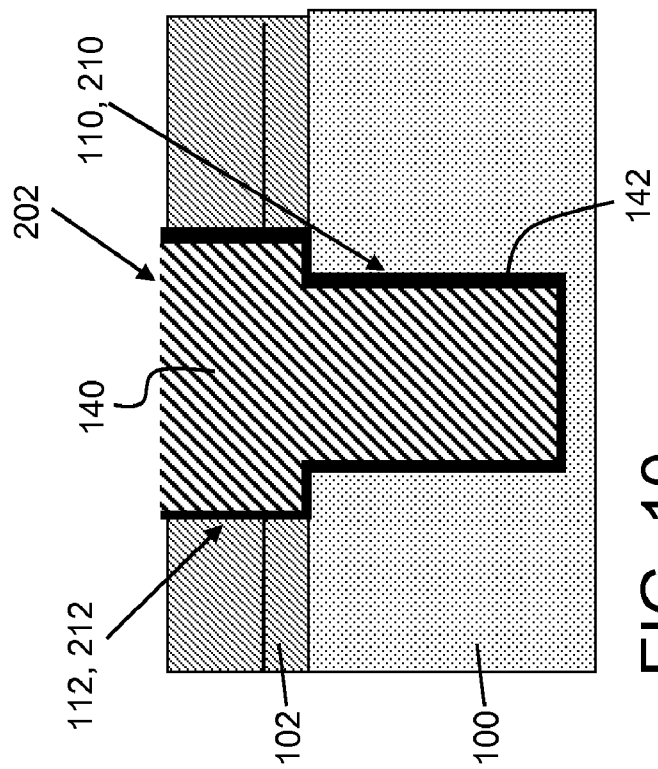
FIGS. 9 and 10 show embodiments of processes for forming a TSV according to embodiments of the invention.
Figure 9:
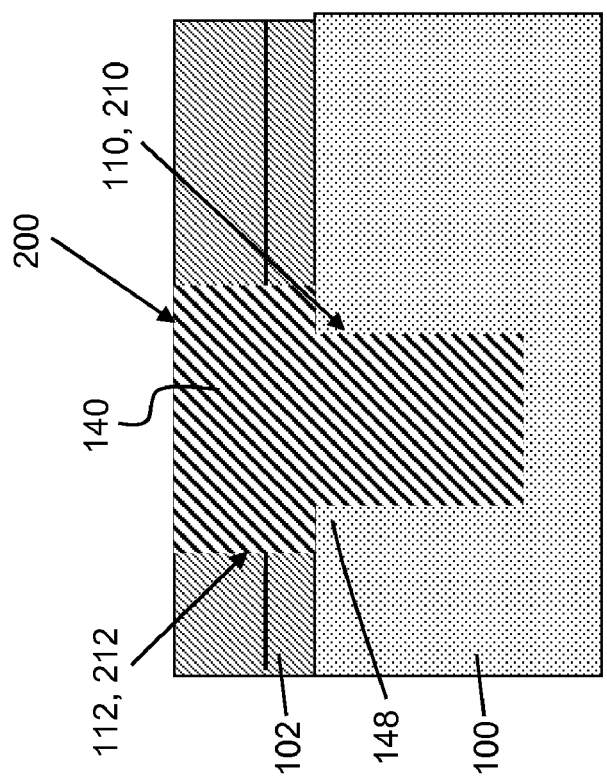

Turning to FIGS. 9 and 10, regardless of which opening forming embodiment is employed, single mask 120, 220 is removed using any now known or later developed techniques appropriate for the material used for the single mask. Next, opening 110, 210 is filled, including expanded upper portion 112, 212, with a conductor 140 to form a TSV 200, 202. The conductor 140 may include any now known or later developed materials appropriate for TSVs, e.g., tungsten (W), copper (Cu), etc. Any liner material required (not shown) may also be employed as known in the art. In FIG. 9, only a conductor 140 is used to form a grounded TSV 200. Alternatively, as shown in FIG. 10, an insulator 142 may line opening 110, 210 with conductor 140 therein to form an insulated TSV 202. The filling process may employ any now known or later developed technique appropriate for the material being used.

Figure 11:
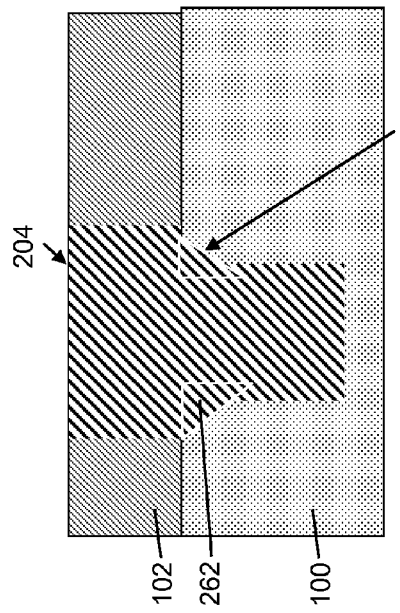
FIGS. 11-14 show alternative and optional processes for rounding corners of an opening for a TSV according to embodiments of the invention.
Figure 12:
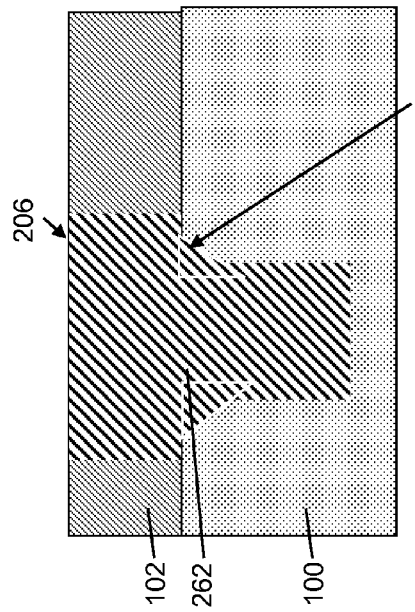
Figure 13:
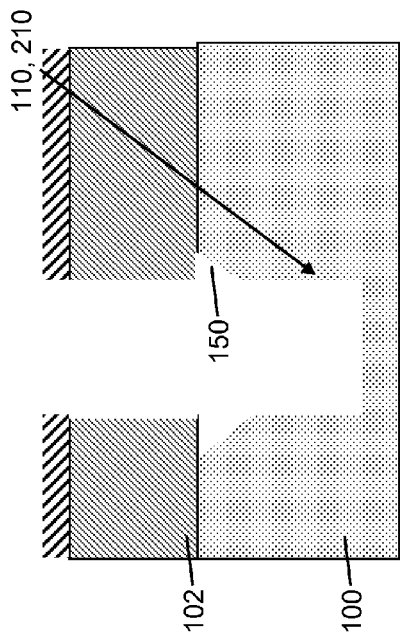
Figure 14:
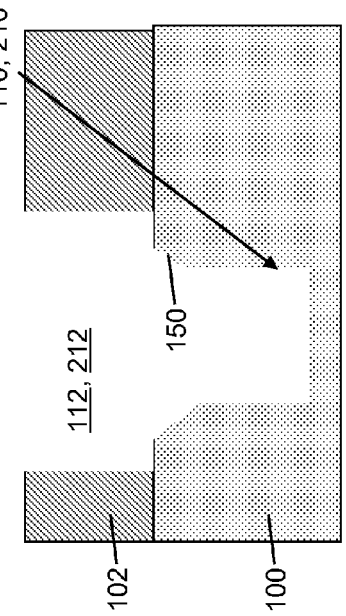

It is noted that either embodiment for forming opening 110, 210 including expanded upper portion 112, 212 expanding creates a stepped transition 148 (FIG. 9) between expanded upper portion 112 and substrate 100. That is, a relatively sharp corner is present in substrate 110 where enlarged portion 112, 212 exists. In an alternative embodiment shown in FIGS. 11-14, however, the process may further include rounding corners of an upper part 150 of opening 110, 210 in substrate 100 subsequent to single mask 120, 220 removing. The corner rounding may include employing a pulsed etching technique, e.g., a Bosch etch. For example, if substrate 100 is silicon, then the Bosch etch could be modified to generate a larger opening (i.e., 1-2 microns wider) than the patterned opening size for substrate 100. Bosch silicon etching may include, for example, alternating sulfur hexafluoride ($SF_6$) etching with perfluorocarbon, such as tetrafluoromethane ($CF_4$), sidewall passivation to form vertical or nearly vertical TSVs. Performing the silicon etching step first, optionally for an extended time, generates a large top surface opening in substrate 100. For example, FIGS. 11 and 12 show performing a pulsed etching subsequent to the second RIE of FIGS. 3 and 7. FIG. 12 shows opening 110, 210 filled thereafter to form a TSV 204. FIGS. 13 and 14 show performing a pulsed etching subsequent to the BHF wet etch to enlarge opening 110, 210 (i.e., create enlarged portion 112, 212) as in FIGS. 4 and 7. FIG. 14 shows opening 110, 210 filled thereafter to form a TSV 206.

As shown in FIGS. 9, 10, 12 and 14, a structure resulting from the above-described processes includes substrate 100, dielectric layer 102 over substrate 100, and a self-aligned TSV 200, 202, 204, 206 extending through dielectric layer 102 and into substrate 100. Each TSV 200, 202, 204, 206 may have any depth required. For example, they may range from about 10 μm to the full depth of the wafer (e.g., about 725 μm). As shown in FIGS. 12 and 14, TSVs 204, 206 may include a rounded corner 260 in substrate 100 at an uppermost portion 262 of the TSV in substrate 100.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for forming a through silicon via (TSV) in a substrate, the method comprising:
forming a dielectric layer on the substrate, wherein the dielectric layer includes a silica glass layer and a silicon nitride layer, and the silica glass layer has one of: a graded phosphorous content or a graded boron content, such that the opening forming creates a tapered opening in the dielectric layer from an upper part of the dielectric layer to a lower part of the dielectric layer;
forming an opening through the dielectric layer and into the substrate using a mask over the dielectric layer;
expanding the opening in the dielectric layer, undercutting the mask, to form an expanded upper portion;
removing the mask; and
filling the opening, including the expanded upper portion, with a conductor.

2. The method of claim 1, wherein the mask comprises a photoresist layer.

3. The method of claim 2, wherein the mask further comprises an anti-reflective coating (ARC).

4. The method of claim 1, wherein the mask comprises an inorganic composite hard mask layer.

5. The method of claim 4, wherein the inorganic composite hard mask layer includes a masking layer and a surface protecting oxide layer.

6. The method of claim 5, wherein the masking layer includes at least one of: alumina, titanium nitride, silicon dioxide and silicon nitride.

7. The method of claim 1, wherein the expanding includes performing a wet etch to form the expanded upper portion in the opening.

8. The method of claim 1, wherein the opening forming includes performing a first reactive ion etch to a surface of the substrate, and performing a second reactive ion etch into the substrate.

9. The method of claim 1, further comprising rounding corners of an upper part of the opening in the substrate subsequent to the mask removing.

10. The method of claim 9, wherein the corners rounding includes employing a pulsed etching.

11. A method for forming a through silicon via (TSV) in a substrate, the method comprising:
forming a dielectric layer on the substrate;
forming an opening through the dielectric layer and into the substrate using a mask over the dielectric layer, the opening forming including performing a first reactive ion etch to a surface of the substrate, and performing a second reactive ion etch into the substrate;
expanding the opening in the dielectric layer, undercutting the mask by performing a wet etch through the opening to form an expanded upper portion in the opening;
removing the mask;
rounding corners of an upper part of the opening in the substrate, wherein the corners rounding includes employing a pulsed etching, and wherein the pulsed etching includes alternating sulfur hexafluoride ($SF_6$) etching with perfluorocarbon sidewall passivation; and
filling the opening, including the expanded upper portion, with a conductor.

12. The method of claim 11, wherein the mask comprises a photoresist layer.

13. The method of claim 12, wherein the mask further comprises an anti-reflective coating (ARC).

14. The method of claim 11, wherein the mask comprises an inorganic composite hard mask layer.

15. A method forming a through silicon via (TSV) in a substrate, the method comprising:
forming a dielectric layer on the substrate;
forming an opening through the dielectric layer and into the substrate using a mask over the dielectric layer;
expanding the opening in the dielectric layer, undercutting the mask, to form an expanded upper portion;
removing the mask;
performing a pulsed etching to round corners of the substrate at an upper part of the opening in the substrate, wherein the pulsed etching includes alternating sulfur hexafluoride ($SF_6$) etching with perfluorocarbon sidewall passivation; and
filling the opening, including the expanded upper portion, with a conductor.

16. The method of claim 15, wherein the mask comprises one of: a photoresist layer, a photoresist layer and an antireflective coating and an inorganic composite hard mask layer.

* * * * *